United States Patent [19]

Kalonji et al.

[11] Patent Number: 4,937,225
[45] Date of Patent: Jun. 26, 1990

[54] RAPID SOLIDIFICATION PROCESSING OF OXIDE SUPERCONDUCTORS

[75] Inventors: Gretchen Kalonji, Arlington; Joanna McKittrick, Somerville; Shinichi Sasayama, Arlington, all of Mass.

[73] Assignee: Massachusetts Institute of Technology, Cambridge, Mass.

[21] Appl. No.: 72,117

[22] Filed: Jul. 10, 1987

[51] Int. Cl.$^5$ .................. H01L 39/12; C01D 1/02; C01F 17/00; C01G 3/02

[52] U.S. Cl. ........................................ 505/1; 505/730; 505/733; 264/8; 264/12; 264/56; 423/263; 423/604; 423/636

[58] Field of Search .............. 148/403; 427/62; 505/1, 505/733, 730; 264/28, 8, 12, 56; 423/593, 604, 636, 263

[56] References Cited

PUBLICATIONS

McKittrick et al., "Crystallization of a Rapidly Solidified $Al_2O_3$–$ZrO_2$ Eutectic Glass", *J. Non-Cryst. Solids*, vol. 94, No. 2 (1987), pp. 163–174.
McKittrick et al., "Microstructural Control of $Al_2O_3$–$ZrO_2$ Ceramics Through Rapid Solidification", *Science and Technology of Zirconia-III*, Advances in Ceramics, vol. 24 American Ceramic Society, 1988.
De Guire et al., "Magnetic Ordering in Splat–Quenched Spinel Ferrite–Silica Compositions", *J. of Magnetism and Magnetic Materials*, vol. 54–57 (1986), pp. 1337–1338.
De Guire et al., "Spinel Ferrite–Silica Glass Obtained by Splat Quenching", *J. Non-Cryst. Solids*, vol. 81 (1986), pp. 351–364.
Geislinger, "Determination of Microstructural Effects on Dielectric Constant in Rapidly Solidified $KNbO_3$," B. S. Thesis, Department of Materials Science and Engineering, MIT, Jun., 1987.
Welch et al, *Time*, May 23, 87.
Wen et al, *Beijing Conf.*, Jun. '87, pp. 97–99.
Ichinose et al, *Intro to Fine Ceramics*, pp. 145–147.
McKittrick, *Adv. Ceram. Mat'ls*, vol. 2, No. 3B, Special Issue, Issue Jul. 1987 (pp. 353–363).
Asahi Shinbun Newspaper, Mar. 10, 1987 (English Translation Enclosed).

*Primary Examiner*—Norman Morgenstern
*Assistant Examiner*—Margaret Bueker
*Attorney, Agent, or Firm*—Choate, Hall & Stewart

[57] ABSTRACT

A superconducting oxide is melted in an oxygen-rich environment, rapidly solidified and annealed in an oxygen atmosphere. The resulting material has a fine grain structure, is chemically homogeneous, and has enhanced resistance to environmental degradation. The materials have well-defined superconducting characteristics as measured through the temperature dependence of their resistivities and diamagnetic susceptibilities.

18 Claims, 7 Drawing Sheets

RAPID SOLIDIFICATION PROCESSING OF OXIDE SUPERCONDUCTORS

BACKGROUND OF THE INVENTION

This invention relates to superconducting material.

Superconductors are materials having zero resistance to the flow of electrons below a certain critical temperature, $T_c$. It is known that certain metal oxides including metallic elements such as Y, La, Ba, Cu, Sr, Eu, and Lu exhibit superconductivity. Examples include $YBa_2Cu_3O_{7-x}$, $La_{2-x}Ba_xCuO_{4-y}$ and $La_{2-x}Sr_xCuO_{4-y}$. It is clear from the earliest reports on these new oxide superconductors that their properties are strongly dependent on processing. Oxygen vacancy concentrations, degree of order, chemical homogeneity, and other microstructural characteristics such as grain size appear to be critical in determining the properties of these oxide superconductors.

SUMMARY OF THE INVENTION

In general, the method for processing superconducting oxides according to the invention features melting the oxide in an oxygen rich environment. The oxide is rapidly solidified and then annealed in an oxygen rich atmosphere. An oxygen hydrogen torch having an oxygen-rich flame may be used to melt the oxide which may be a sintered pellet. The melted oxide is solidified at a rate exceeding $10^3$K per second. Such rapid solidification may be achieved by gas atomization, twin-rolling quenching, or melt extraction in which the melted oxide contacts a spinning wheel which flings the still molten materials into a collection chamber. In one embodiment, the spinning wheel in the melt extraction process is copper and rotates in the speed range of 2,000–5,000 rpm. The oxides resulting from the present process have both crystalline and amorphous or glassy structures.

The superconducting oxides made by the invention exhibit fine grain size structures and high degrees of chemical homogeneity. Furthermore, the oxides exhibit enhanced resistance to environmental degradation. The process also results in the ability to quench the material in a variety of metastable phases.

BRIEF DESCRIPTION OF THE DRAWING

FIG. 2b is a top view of the twin rolling quenching device of FIG. 2a;

DESCRIPTION OF THE PREFERRED EMBODIMENT

The beginning materials utilized in the present process are superconducting oxides such as pellets of $Y_2O_3:BaO:CuO$ having molar ratios of 1:2:3, 1:3:4, and 1:2.5:3.5. The pellets are prepared according to conventional sintering methods such as described by J. M. Tarascon et al. in "Superconductivity at 90K in a Multi-Phase Oxide of Y Ba Cu", Phys. Rev. B (to be published, copy attached). The teachings of this paper are hereby incorporated by reference and made part of this application. Samples of average composition $Y_{2-x}M_xCuO_{4-y}$ can be prepared from appropriate amounts of $Y_2O_3$, CuO, and $MCO_3$, all 99.999% pure. The materials are mixed, and pressed into a pellet of 12 mm diameter at 10K bar. They are then heated in a platinum boat in a tubular furnace under flowing oxygen to 1100° C. in twelve hours, held at that temperature for forty-eight hours, and cooled to room temperature in three hours. The present method is applicable to any superconducting oxide.

The conventionally produced oxide is melted in an oxygen rich environment to prevent reduction. A suitable technique for melting the oxide is the use of an oxygen hydrogen torch having an oxygen rich flame which will be illustrated below in conjunction with FIG. 3. After the superconducting oxide material is melted, it must be rapidly solidified to produce a material with the desired fine grain size structure, homogeneity and enhanced resistance to environmental degradation. The solidification rate is greater than $10^3$K per second and preferably is in the range of $10^5$–$10^6$K per second. Among techniques for such rapid solidification are gas atomization, twin rolling quenching and melt extraction. After solidification, the materials are annealed in flowing $O_2$ for 16 hours at 700° C.

Figure 1A:
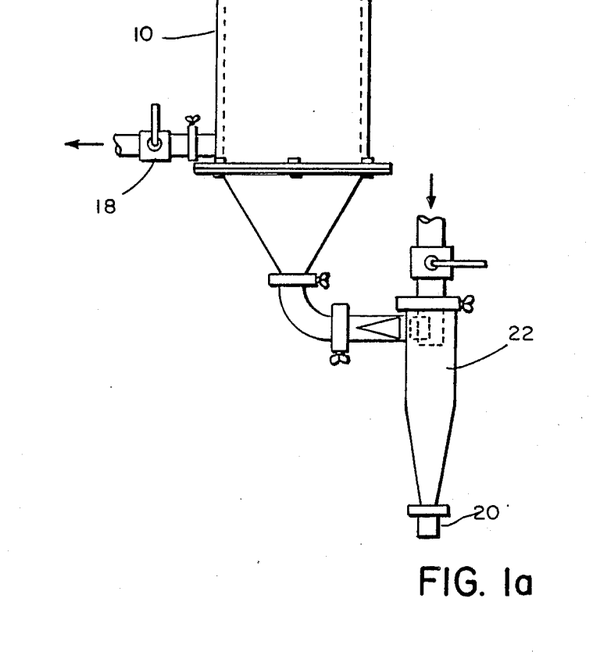
FIG. 1a is a side elevational view of a gas atomization chamber.
Figure 1B:
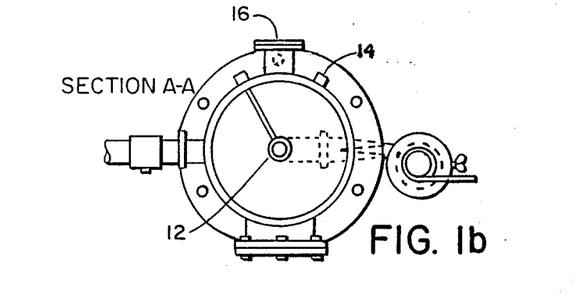
FIG. 1b is a cross sectional view of the gas atomization chamber of FIG. 1a along section lines A—A.

The gas atomization technique for rapid solidification will now be described in conjunction with FIGS. 1a and 1b. A gas atomization chamber 10 includes an atomizing die or nozzle 12 and inlets 14 for an atomizing gas, injection gas and a thermocouple. Also provided is an RF feed through port 16. The atomization chamber 10 is evacuated through a port 18. The molten superconducting oxide material passes through the atomizing die 12 where it is broken by the atomizing gas into small droplets which solidify and collect in a powder collector 20 at the lower portion of a cyclone 22. The material is initially melted by RF energy introduced into the chamber 10 through the RF feed through port 16. The RF field may couple directly to the sample or to a crucible which then heats the sample or, in the case of crucibleless melting, to a conductive sleeve surrounding the sample.

Figure 2A:
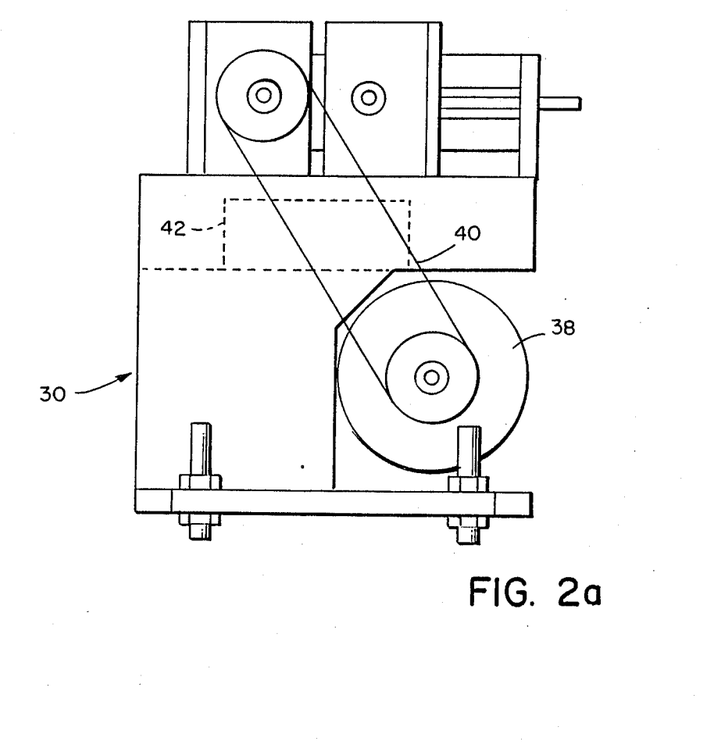
FIG. 2a is a side elevational view of a twin rolling quenching device.
Figure 2B:
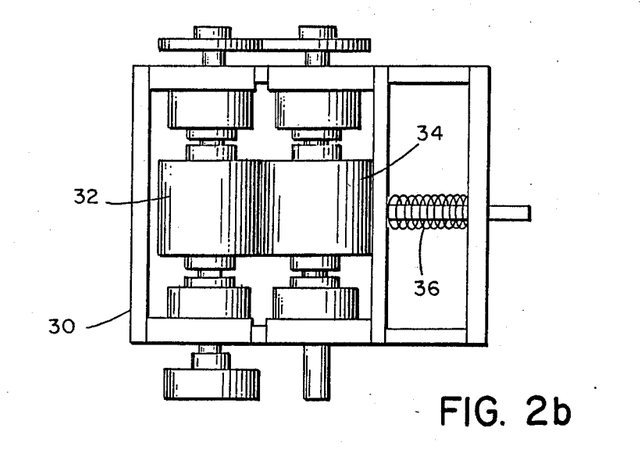

Another rapid quenching technique is illustrated in FIGS. 2a and 2b. The quenching apparatus 30 includes a pair of low carbon steel rollers 32 and 34 which are pressed together by a spring 36. The rollers are driven in opposite directions at a speed of 2,000–6,000 rpm by a motor 38 and a belt 40. In operation, molten droplets are solidified as they pass between the rollers 32 and 34 to generate small ribbons of material. The ribbons are collected in a collection box 42. It should be noted that the twin roller device 30 may be placed inside the atomization chamber 10 of FIG. 1a to replace the atomization nozzle 12. In this case, the rapid solidification can be conducted under controlled atmosphere conditions. This atmospheric control is important for all ceramic superconductors, and, in particular, for $YBa_2Cu_3O_{7-x}$ materials in which it has been determined that concentration of oxygen vacancies and their degree of order play a critical role in the superconducting behavior.

Figure 3:
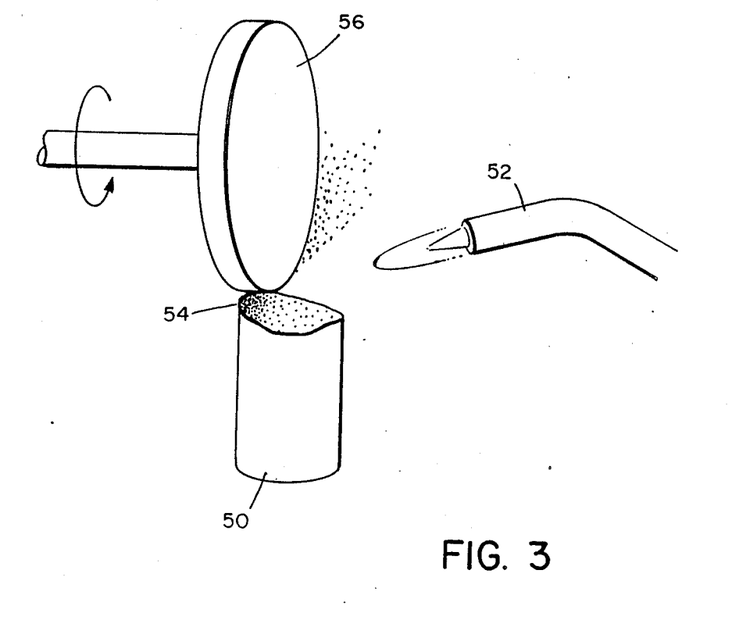
FIG. 3 is a schematic illustration of the melt extraction technique for rapid solidification.

Yet another rapid solidification technique is illustrated in FIG. 3 and is known as melt extraction. A sintered pellet 50 of a superconducting oxide material is heated by an oxygen hydrogen torch 52 operated with an oxygen-rich flame. The torch 52 creates a pool of melt 54 on top of the pellet 50. The melt 54 is quenched by touching a spinning copper wheel 56 to the surface of the melt which flings the still molten material into a collection chamber (not shown). The wheel 56 rotates in the range of 2,000–5,000 rpm. The estimated quench rate for this technique is approximately $10^5$–$10^6$K per second. The relatively large variation in cooling rate results in products which show a variety of microstructural features.

EXAMPLE 1

Figure 4:
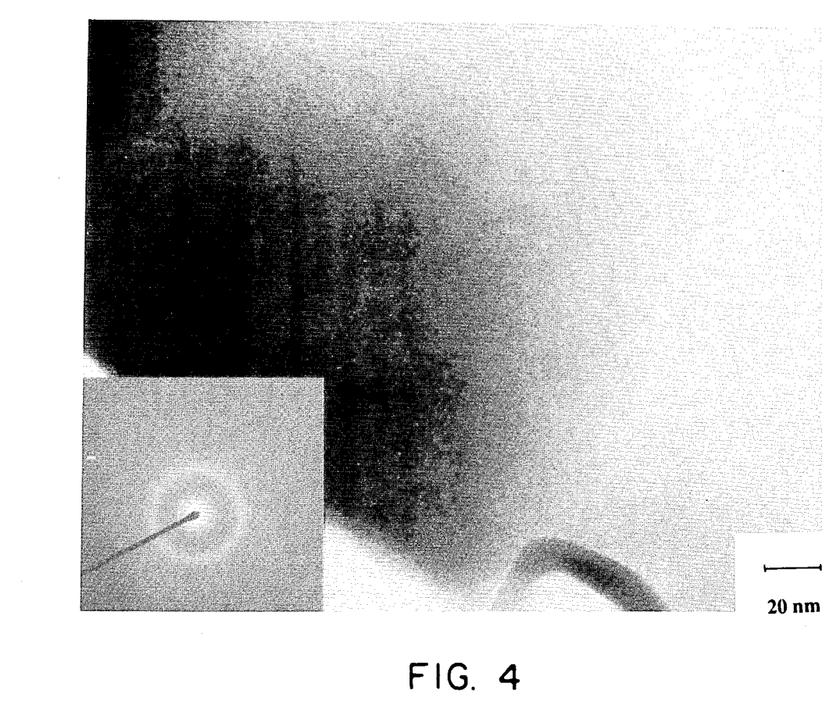
FIG. 4 is a transmission electron photomicrograph of a rapidly solidified flake of a superconducting oxide produced by the method of the invention exhibiting cubic precipitates in a glassy matrix.

Pellets having molar ratio of the oxides $Y_2O_3$:BaO:CuO of 1:2:3, 1:3:4, and 1:2.5:3.5 were prepared according to conventional methods described in the Tarascon reference cited above. The starting powders had a nominal purity level of 99.999% for $BaCO_3$ and CuO and 99.99% for $Y_2O_3$. The pellets were melted using an $H_2$—$O_2$ torch with an $O_2$ rich flame. These materials become completely molten at approximately 1600° C. The melt was quenched using the melt extraction technique described in conjunction with FIG. 3. For all three of the molar compositions, rapid solidification resulted in the generation of previously undiscovered phases. Rapid solidification of the 1:2:3 compound resulted in a cubic structure with a lattice parameter of 0.701 nm and in the formation of glassy materials. FIG. 4 is a transmission electron micrograph of amorphous 1:2:3 material containing cubic precipitates and a selected area diffraction (SAD) pattern from the same region. The as quenched 1:3:4 and 1:2.5:3.5 diffraction patterns cannot be indexed to any known compounds in the $Y_2O_3$ - BaO-CuO system either.

Figure 5:
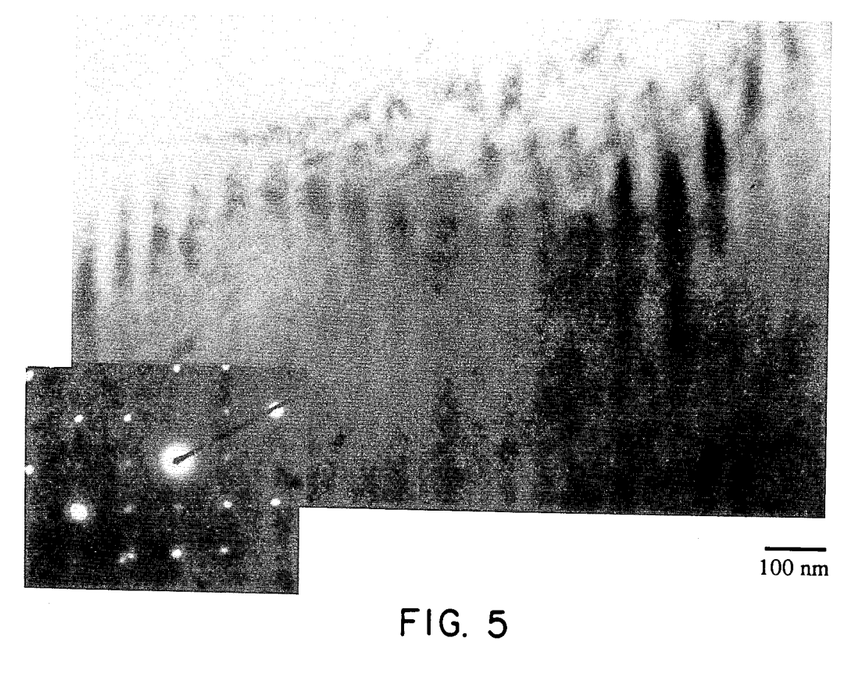
FIG. 5 is a transmission electron photomicrograph of an $O_2$ annealed rapidly solidified flake of a compound made by the method of the invention.

The three compounds were annealed in flowing $O_2$ for 16 hours at 700° C. which transforms the materials into a two phase mixture of the orthorhombic superconducting phase of 1:2:3 with varying quantities of $BaCuO_2$. The 1:2:3 composition contains no $BaCuO_2$, the 1:2.5:3.5 compound contains a trace amount and the 1:3:4 composition contains a significant amount of $BaCuO_2$. A transmission electron microscope micrograph of a rapidly solidified flake of the 1:2:3 composition, exhibiting the characteristic twins of the orthorhombic phase, appears in FIG. 5. The electron diffraction pattern in the lower left portion of FIG. 5 was taken along the [001] axis.

Figure 6:
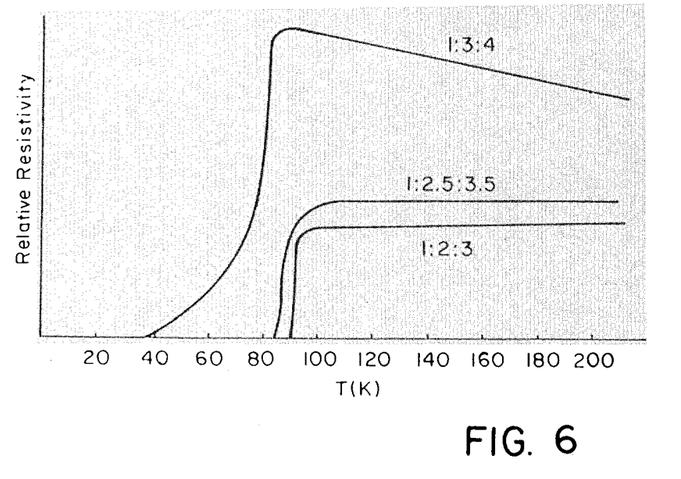
FIG. 6 is a graph of electrical resistivity versus temperature for materials made according to the present invention.

Resistivity versus temperature measurements were performed on the annealed 1:2:3, 1:3:4, and 1:2.5:3.5 compositions and were taken with the four probe technique using silver paint contacts. The results are shown in FIG. 6. The curves in FIG. 6 are displaced vertically for clarity. The 1:2:3 compound exhibits the highest transition temperature (91.6K) and the narrowest transition width (0.8K).

Figure 7:
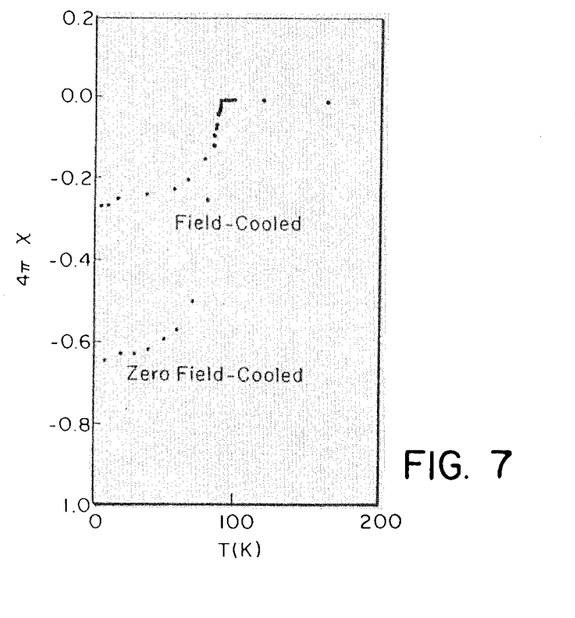
FIG. 7 is a graph of diamagnetic susceptibility versus temperature for materials made by the present invention.

FIG. 7 shows field cooled (FC) and zero field cooled (ZFC) magnetic moments as a function of temperature of the melt extracted 1:2:3 material which had been annealed in oxygen. The melt extracted material was crushed and pressed into a pellet. The magnetic measurements were made on a SQUID magnetometer. A 0.076 gram sample cut from the melt extracted pellet was cooled in zero field to 10K. The sample was then heated in a field of H=100Oe and magnetization versus temperature recorded. This data is shown by the points labeled "zero field cooled" in FIG. 7. After heating to 240K, the sample was subsequently cooled in the same 100Oe field. The magnetization versus temperature curve for this process is labeled "field cooled". The field cooled sample is indicative of the Meissner effect while the zero field cooled sample represents the shielding effect. Based on the mass and ideal density of 6.36 grams/cm$^3$, a diamagnetic susceptibility of $2.09 \times 10^{-2}$ emu/Oe·cm$^3$ is calculated, which represents 26% of ideal diamagnetism. The superconducting transition temperature as derived from the change from paramagnetic to diamagnetic response was measured to be approximately 88K in good quantative agreement with the resistivity data as measured at midpoint.

Figure 8:
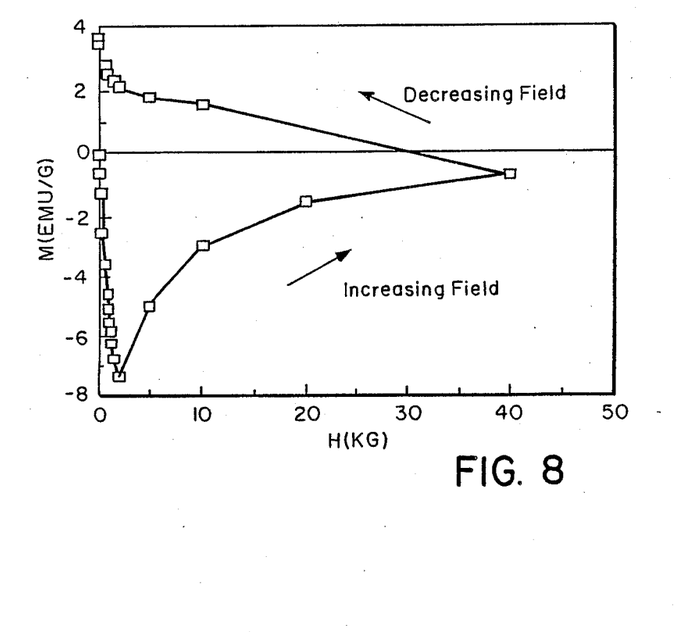
FIG. 8 is a graph of type 2 magnetization versus field data.
Figure 9:
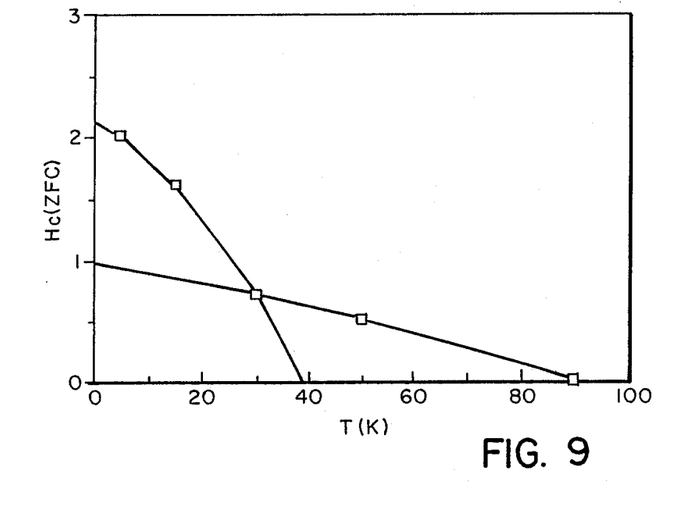
FIG. 9 is a graph of critical field versus temperature for $O_2$ annealed, rapidly solidified material made according to the invention.

Magnetization versus field data for the 1:2:3 material is shown in FIG. 8. The high degree of irreversible magnetization attained is indicative of the presence of a high concentration of flux pinning sites. A very interesting tendency in the critical field versus temperature is shown in FIG. 9. The data is most readily interpretable in terms of a superposition of two critical field behaviors, one having a critical temperature at zero field of 90K, and the other of approximately 40K. This behavior may be a manifestation of the presence of a superconducting glass or amorphous state.

The materials made according to the invention exhibit greatly enhanced resistance to environmental degradation. Samples have remained in air for as long as one month with no degradation in the superconducting characteristics, while materials processed by conventional ceramics routes begin to experience degradation in a few days when exposed to atmospheric moisture.

What is claimed is:

1. Method for processing a copper-containing superconducting oxide comprising:
   melting the oxide in an oxygen-rich environment;
   rapidly solidifying the oxide at a rate greater than $10^3$K per second; and
   annealing the oxide in an oxygen-rich atmosphere.

2. The method of claim 1 wherein the oxide is melted with an $O_2$—$H_2$ torch having an oxygen rich flame.

3. The method of claim 1 wherein the superconducting oxide before melting is a sintered pellet.

4. The method of claim 1 wherein the solidification rate is in the range of $10^5$–$10^6$K per second.

5. The method of claim 1 wherein the rapid solidification comprises gas atomization.

6. The method of claim 1 wherein the rapid solidification comprises twin-rolling quenching.

7. The method of claim 1 wherein the rapid solidification comprises contacting the melting oxide with a spinning wheel.

8. The method of claim 7 wherein the spinning wheel is copper.

9. The method of claim 7 wherein the spinning wheel rotates in the range of 2,000–5,000 rpm.

10. The method of claim 6 wherein the twin rollers rotate in the range of 2,000–6,000 rpm.

11. The method of claim 1 wherein the superconducting oxide is $YBa_2Cu_3O_{7-x}$.

12. The method of claim 1 wherein the superconducting oxide includes metallic elements selected from the group Y, La, Ba, Cu, Sr, Eu, Lu.

13. The method of claim 1 wherein the superconducting oxide comprises Y, Ba, and Cu.

14. A superconducting oxide prepared according to the method of one of claims 1-3, 4-13.

15. A superconducting oxide prepared according to claim 1 having a crystalline structure.

16. A superconductive oxide prepared according to claim 1 having an amorphous or glassy structure.

17. A superconducting oxide prepared according to claim 15 wherein the structure is cubic.

18. A superconducting oxide prepared according to claim 15 wherein the structure is orthorhombic.

* * * * *